United States Patent
Vogley

(12) 
(10) Patent No.: US 6,285,625 B1
(45) Date of Patent: *Sep. 4, 2001

(54) HIGH-SPEED CLOCK CIRCUIT FOR SEMICONDUCTOR MEMORY DEVICE

(75) Inventor: Wilbur C. Vogley, Missouri City, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,693

(22) Filed: Sep. 13, 1999

Related U.S. Application Data

(60) Provisional application No. 60/100,205, filed on Sep. 14, 1998.

(51) Int. Cl.$^7$ .................................................. G11C 7/00
(52) U.S. Cl. ................................. 365/233; 365/189.07
(58) Field of Search ............................... 365/233, 189.07; 327/255, 238, 254, 344

(56) References Cited

U.S. PATENT DOCUMENTS

| | | | |
|---|---|---|---|
| 5,808,498 | * | 9/1998 | Donnelly .............................. 327/255 |
| 6,091,663 | * | 7/2000 | Kim ..................................... 365/233 |

* cited by examiner

*Primary Examiner*—A. Zarabian
(74) *Attorney, Agent, or Firm*—Dwight N. Holmbo; Wade James Brady, III; Frederick J. Telecky, Jr.

(57) ABSTRACT

A synchronous dynamic random access memory (SDRAM) (500) is disclosed. The SDRAM (500) operates in synchronism with differential clock signals (CLK and /CLK). A timing and control circuit (510) compares the complementary differential clock signals (CLK and /CLK) to generate an internal clock signal (CLKI). By comparing the differential clock signals (CLK and /CLK) to generate the internal clock signal (CLKI), the preferred embodiment can compensate for degradations in the differential clock signals (CLK and /CLK). In addition, by utilizing the internal timing signal (CLKI) the preferred embodiment does not have to employ more complex circuits that must operate in synchronism with the edges of both differential clock signals (CLK and /CLK).

18 Claims, 3 Drawing Sheets

US 6,285,625 B1

HIGH-SPEED CLOCK CIRCUIT FOR SEMICONDUCTOR MEMORY DEVICE

This application claims priority under 35 USC §119(e)(1) of provisional application No. 60/100,205 filed Sep. 14, 1998.

TECHNICAL FIELD

The present invention relates generally to semiconductor memory devices, and more particularly to timing approaches for synchronous integrated circuit devices.

BACKGROUND OF THE INVENTION

As the design improvements and manufacturing capabilities of integrated circuits and electronic components continues to progress, the speed at which systems process data also increases. The increased data processing capabilities of electronic systems has led to the need for memory devices that can provide as much data at as high a rate as possible. Increased data transmission rates (data bandwidth) have been achieved using a number of approaches. One approach has been to increase the data word size of the system (i.e., the number of bits accessed in a given read or write operation). Such approaches can be limiting, as wider words require wider system buses, which can increase the overall physical size of the system. Another approach is to increase the rate at which read operations can take place (i.e., increase the speed at which data can be read from or written to a memory device). A third way to increase data bandwidth is to increase the efficiency with which a data bus is utilized. Increased bus efficiency has given rise to synchronous systems.

Synchronous systems typically include a number of devices that operate in synchronism with a system clock. For example, a synchronous system would include a synchronous memory device that can be configured to provide output data on a predetermined number of clock cycles following the application of an address. Thus, data processing devices that read data from such a memory device (such as a microprocessor, or the like) do not have to monopolize the data bus following a read command, as the data processing device will essentially "know" when the data will be available. For even more efficient transfer of data, a synchronous memory device can include a burst mode in which data accesses (read operations or write operations) can occur on consecutive cycles of the system clock.

A common type of synchronous memory device is the synchronous random access memory (RAM). In a typical synchronous RAM, address and command inputs are latched on the rising edge of the system clock signal. In the same fashion, input data are latched, or output data are provided in synchronism with the system clock. In order to ensure accurate timing of such operations, it is important that the synchronous RAM be able to receive the system clock signal, and distribute it internally to various circuits within, including input latches and output buffers.

In a conventional synchronous system the various operations of devices within the system are timed off the rising edge of the system clock. Accordingly, conventional synchronous RAMs are expected to latch address data, command data, and input data, and to provide output data on the rising edge of the system clock. Such synchronous operations are usually achieved by a clock circuit within the synchronous RAM that buffers the system clock signal, and distributes it to the other circuits of the synchronous RAM. The other circuits within the synchronous RAM are designed to be activated on the rising edge of the internal clock. In order to compensate for propagation delays of timing signals, the synchronous RAM may include a phase locked loop circuit (PLL) or a delay locked loop circuit (DLL) to shift the phase of internal timing signals.

The desire to provide faster speed systems has given rise to double data rate (DDR) devices. DDR devices typically operate in synchronism with the rising edge of the system clock, and in addition, with the rising edge of an inverse system clock. The use of such "differential" clock signals allows the DDR devices to essentially operate at twice the system clock frequency.

Referring now to FIG. 1, an example of a DDR synchronous RAM is set forth in a block schematic diagram. The DDR RAM is designated by the general reference character 100 and shown to include a memory cell array 102 having a number of memory cells that are accessed by a row select circuit 104, and a input/output (I/O) path circuit 106. When activated, the row select and I/O path circuits (104 and 106) access memory cells according to a row address (ROWADD) and a column address (COLADD). The row and column addresses (ROWADD and COLADD) are provided by an address buffer 108. The address buffer 108, row select circuit 104, and I/O path circuit 106 are each activated by timing signals provided from a timing and control circuit 110.

The timing and control circuit 110 receives differential clock signals, shown as CLK and /CLK, and a number of control signals, shown as CTRL. In addition, the timing and control circuit 110 receives a reference signal REF from a reference circuit 112. In response to the various inputs, the timing and control circuit 110 provides address control signals ADDCTRL, row control signals RCTRL, column control signals CCTRL, and I/O control signals I/OCTRL. The ADDCTRL signals activate the address buffer 108, latching address data. The RCTRL signals activate the row select circuit 104, resulting in the selection of a row of memory cells within the array of memory cells 102. The column control signals CCTRL activate a column select circuit 114 within the I/O path circuit 106, resulting in access to selected columns of the array of memory cells 102. The I/O CTRL signals activate an I/O buffer 116 within the I/O path circuit, resulting in the latching of input data or the driving of output data on a number of data I/Os 118. It is understood that the ADDCTRL, RCTRL, CCTRL and I/OCTRL signals can all be synchronous with the CLK and /CLK signals.

Referring now to FIG. 2, a block schematic diagram is set forth illustrating the timing and control circuit, shown as 110 in FIG. 1. The timing and control circuit is designated by the general reference character 200, and is shown to include a first differential clock receiver 202, a second differential clock receiver 204 and a control logic circuit 206. The first differential clock receiver 202 receives the system clock signal CLK and the reference signal REF. The first differential clock receiver 202 compares the CLK signal with the REF signal to generate an internal clock signal CLKI. In a similar fashion, the second differential clock receiver 204 compares the /CLK signal with the reference signal REF to generate an internal inverse clock signal /CLKI. The CLKI and /CLKI signals, in addition to the CTRL signals, are coupled to the control logic circuit 206. In response to the control signals CTRL, the control logic circuit 206 activates the ADDCTRL, RCTRL, CCTRL and I/OCTRL signals in synchronism with the CLKI and /CLKI signals.

FIG. 3 is provided to illustrate the first and second differential clock receivers (202 and 204). The differential clock receivers (202 and 204) are amplifier circuits that amplify the difference between the REF signal and the clock signal receives (CLK or /CLK). The clock receivers (202 and 204) are necessary as the clock signals received by the synchronous RAMs (CLK or /CLK) may not be ideal.

To better illustrate the operation of the synchronous memory device of FIGS. 1 and 2, a timing diagram is set forth in FIG. 4. The timing diagram includes a number of timing signals including a system clock signal CLKS, an inverse system clock signal /CLKS, a received clock signal CLK, a received inverse clock signal /CLK, a reference signal REF, a resulting internal clock signal CLKI, a resulting inverse internal clock signal /CLKI, and a sample data input signal DQ. The system clock signals (CLKS and /CLKS) represent the differential clock signals as they appear at the system clock source, and so are have an ideal form (a generally square wave shape). The received differential clock signals (CLK and /CLK) represent the resulting non-ideal clock signals received by the synchronous memory device. The non-ideal response can result from the impedance, noise, and transmission line effects on the lines carrying the differential clock signals.

In FIG. 4, the REF signal is shown superimposed over the CLK and /CLK signals. The CLK and /CLK signals are shown to both transition between logic high value and a logic low value, with the /CLK clock being the general inverse of the CLK signal. The REF signal is shown to be about midway between the logic high and logic low level. By operation of the differential clock receivers (202 and 204), when the CLK signal is higher than the REF signal, the CLKI signal will be driven high. Further, when the CLK signal is lower than the REF signal, the CLKI signal will be driven low. Conversely, the /CLKI signal is driven between a high and low level according to whether the /CLK signal is higher or lower than the REF signal. In this manner, the differential clock receivers (202 and 204) generate CLKI and /CLKI signals that are synchronous with the CLK and /CLK signals.

A drawback to memory devices, such as that set forth in FIGS. 1–3, is the added complexity required to make the various circuits within the memory device responsive to the rising edge of both the CLKI and /CLKI signals. For example, the timing and control circuit 110 could generate a first I/OCTRL signal, synchronous with the CLKI signal, and a second I/OCTRL signal synchronous with the /CLKI signal. The I/O buffer 116 would be activated by the rising edges of both the first I/OCTRL signal as well as the second I/OCTRL signals. Alternatively, the edges of both differential clock signals could be used to generate an internal clock signal at twice the frequency. Thus, although the DDR RAM 100 receives differential clock signals at one frequency, the various circuits within the DDR RAM 100 operate at twice the frequency. This is best illustrated by the DQ waveform, which shows that input data can be latched at twice the rate of the CLKS and /CLKS signals.

While the DDR RAM can provide data access rates at twice the frequency of the differential clock signals, the circuits within must be responsive to the rising edges of two clock signals. This is in contrast to conventional synchronous RAMs, which have circuits that are activated in response to the rising edge of a single clock signal. Thus, DDR RAMs can require more complex internal circuits.

It would be desirable to provide a RAM that can operate with a differential clock input, but that does not require the specialized circuits necessary to operate in synchronism with two different differential clock signals.

SUMMARY OF THE INVENTION

According to the preferred embodiment, a random access memory (RAM) operates according to differential clock signals by comparing the complementary differential clock signals to generate a single internal timing signal. By comparing complementary timing signals, the preferred embodiment can provide a rapid internal timing signal despite degradation in the differential clock signals. The RAM can benefit from existing RAM design approaches as it does not require circuits that are responsive to edges of both differential clock signals, as is the case for conventional double data rate (DDR) RAM approaches.

According to one aspect of the preferred embodiment, the RAM is a synchronous DRAM.

According to another aspect of the preferred embodiment, the RAM includes an amplifier circuit that receives one differential clock signal at one input, and the other differential clock signal at the other input. The output of the amplifier circuit is used to generate a single internal timing signal.

DETAILED DESCRIPTION OF THE EMBODIMENTS

The preferred embodiment is a timing approach for a synchronous random access memory (RAM) that receives differential clock signals. Rather than utilize the edges of both differential clock signals to activate various timing signals and/or circuits within the synchronous RAM, the preferred embodiment utilizes the complementary differential clock signals to generate a single internal clock signal. The differential clock signals can run at an increased speed to provide rapid RAM access speeds. The preferred embodiment generates the single internal clock signal by coupling the differential clock signals to opposing inputs of a differential amplifier. By comparing the complementary differential clock signals to generate the internal clock signal, the preferred embodiment can provide a more rapid internal clock signal by compensating for any degradation in the differential clock signals.

The preferred embodiment is a synchronous dynamic RAM (SDRAM) that is capable of receiving complementary differential clock signals, but that does not require internal circuits that are specially modified to be responsive to two clock signals. Further, the preferred embodiment does not require a reference circuit to generate a reference voltage, as is the case of the DDR RAM of FIG. 1. Thus, the preferred embodiment SDRAM can provide higher speed performance, but make use of existing SDRAM internal circuits that operate in synchronism with a single clock signal. This provides a high-speed SDRAM that is less complex and more economical than a conventional DDR RAM approach. Due to the prevalence and desirability of DRAMs as a memory device of choice, the unique clocking scheme set forth herein, while not limited to DRAMs, can be particularly advantageous when utilized in DRAMs.

Figure 5:
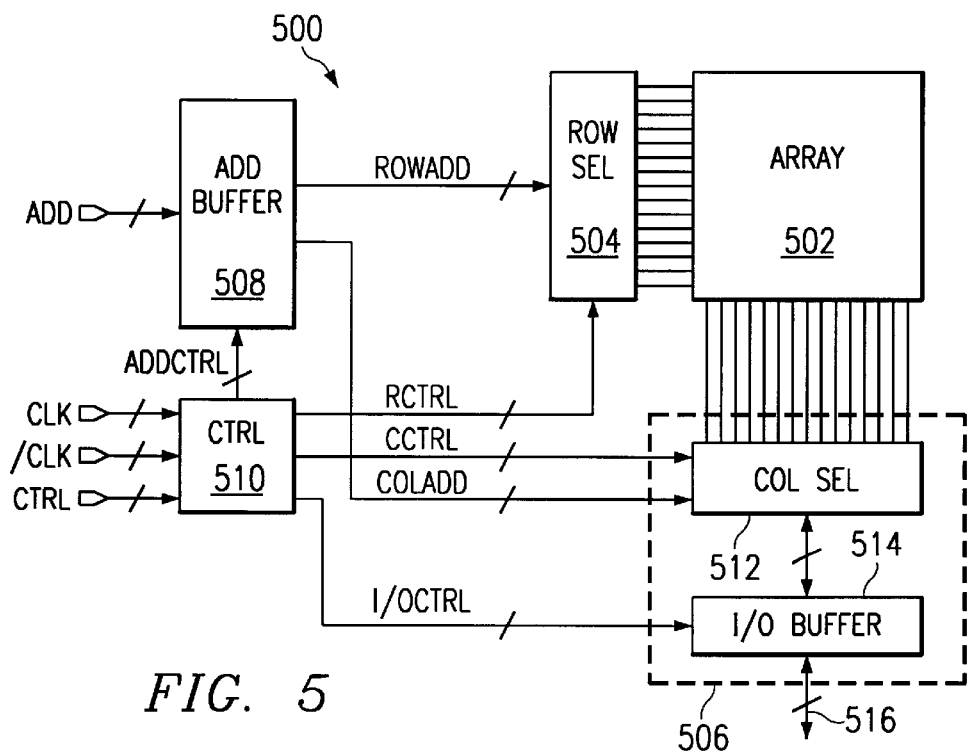
FIG. 5 is a block schematic diagram of the preferred embodiment.

Referring now to FIG. 5, a block schematic diagram is set forth illustrating the preferred embodiment SDRAM. The SDRAM is designated by the general reference character 500, and is shown to include a memory cell array 502. The memory cell array 502 includes a plurality of DRAM memory cells arranged into rows and columns. It is understood that the memory cell array 502 could be subdivided both physically and logically into a number of smaller sections, such as multiple banks or the like. The memory cells of the memory cell array 502 are accessed on a row-wise basis by a row select circuit 504. The row select circuit 504 accesses a given row in response to a row address ROWADD and row control signal RCTRL. It is noted that the row select circuit 504 is essentially conventional in design, activating a given row when the RCTRL signals are active. The RCTRL signals, as will be discussed in more detail, are active in synchronism with a single clock signal, and not the edges of two clock signals, as is the case of the DDR RAM set forth in FIG. 1.

In a similar fashion, the memory cells of the memory cell array 502 are accessed on a column-wise basis by an input/output (I/O) path circuit 506. Data paths within the I/O path circuit 506 are enabled according to a column address COLADD, column control signals CCTRL, and I/O control signals I/OCTRL. As in the case of the row select circuit 504, the control signals of the I/O path circuit 506 (the CCTRL and I/OCTRL signals) are synchronous with a single internal clock, allowing the I/O path circuit 506 to be advantageously like conventional I/O path circuits 506 (i.e., not activated in response to edges of both differential clock signals).

The column and row addresses (COLADD and ROWADD) are provided by an address buffer 508. The address buffer 508 receives an external address ADD and address buffer control signals ADDCTRL. In response to these signals, the address buffer 508 will latch an to address. In the preferred embodiment 500, multiplexed addressing is used. Thus, a row address is initially received and latched to provide the ROWADD to the row select circuit 504. Subsequently one or more column addresses will be latched, to provide COLADDs to the I/O path circuit 506. Unlike the address buffer of the DDR RAM of FIG. 1, the address buffer 508 of the preferred embodiment is essentially conventional in design. Accordingly, the ADDCTRL signals are activated in synchronism with one internal clock signal, and not the edges of differential clock signals.

The ADDCTRL, RCTRL, CCTRL and I/OCTRL signals are provided by a timing and control circuit 510. The timing and control circuit 510 is shown to receive external control signals CTRL and differential clock signals CLK and /CLK. In response to these signals, the various control signals (ADDCTRL, RCTRL, CCTRL and I/OCTRL) are activated in synchronism with the CLK signals. This is in contrast to the DDR RAM of FIG. 1, in which the various control signals are activated in synchronism with the rising edges of both differential clock signals. It is understood that in the preferred embodiment, synchronism does not necessarily indicate simultaneity. The control signals (ADDCTRL, RCTRL, CCTRL and I/OCTRL) may be delayed or phase-shifted forward with respect to the CLK and /CLK signals.

Referring once again to FIG. 5, the I/O path circuit 506 is shown to include a column select circuit 512 that is activated by the CCTRL signals, and that receives the column address COLADD. When activated, the column select circuit 512 accesses selected columns within the memory cell array 502. Because the CCTRL is essentially conventional in timing (i.e., it does not follow the DDR RAM type timing), the column select circuit 512 can be conventional is design, allowing the preferred embodiment to be readily implemented using existing design and layout approaches. Also included within the I/O path circuit 506 is an I/O buffer 514. The I/O buffer 514 provides output data and latches input data in response to the I/OBUFF signal. Due to the timing of the I/OBUFF signal, the I/O buffer 514 can also be essentially conventional in design. External data is presented and received on a number of data I/Os 516. In the preferred embodiment 500, the I/O buffer 514 of the SDRAM can include prefetch circuits or the like. In such a case the number of data bits provided by the column select circuit 512 would be greater than the number of data I/Os.

It is noted that while the row select circuit 504, column select circuit 512 and I/O buffers 514 are shown as unitary structures in FIG. 5, these circuits (504, 512 and 514) may be divided into sections, with each section being associated with a memory bank of the array 502.

It is further noted that the preferred embodiment SDRAM 500 the timing and control circuit 510 does not receive a reference signal. Thus, the SDRAM 500 does not include a reference circuit, such as that shown as item 112 in FIG. 1. By dispensing with the need for a reference circuit, the preferred embodiment can be more compact and less complex than the DDR RAM of FIG. 1.

Figure 6:
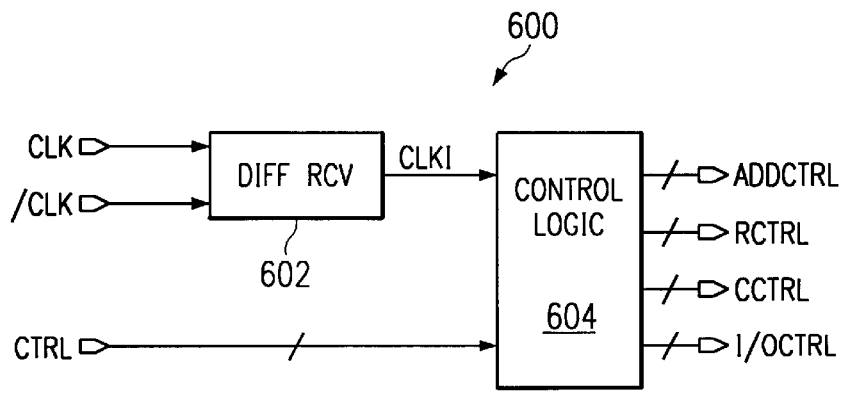
FIG. 6 is a block schematic diagram of a timing and control circuit that may be used in the preferred embodiment.

Referring now to FIG. 6, a timing and control circuit that may be used in the preferred embodiment is set forth in a block schematic diagram. The timing and control circuit is designated by the general reference character 600, and may be used as the circuit shown as item 510 in FIG. 5. The timing and control circuit 600 includes a differential clock receiver 602 and a control logic circuit 604. Unlike the DDR RAM approach of FIG. 1, the preferred embodiment differential clock receiver 602 does not receive one of the differential clocks and a reference signal. Instead, as set forth in FIG. 6, the differential clock receiver 602 receives both differential clock signals (CLK and /CLK) and provides a single clock signal CLKI. Furthermore, the control logic circuit 604, unlike that of FIG. 2, receives only the CLKI signal and the control signals 604. This arrangement obviates the need for a control logic circuit that is responsive to two internal clock signals, thereby reducing the complexity of the preferred embodiment. The control logic circuit 604 generates the ADDCTRL, RCTRL, CCTRL and I/OCTRL signals, which are activated in synchronism with the CLKI signal.

Figure 7:
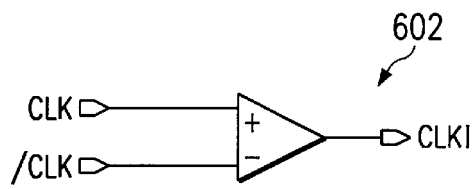
FIG. 7 is a schematic diagram illustrating a differential clock receiver that may be used in the preferred embodiment.

FIG. 7 sets forth one example of a differential clock receiver that may be used as the differential clock receiver 602 set forth in FIG. 6. The differential clock receiver 602 is shown to include a differential amplifier, having the CLK signal coupled to its "+" input, and the /CLK signal coupled to its "−" input. This arrangement is advantageous because it uses the complementary nature of the CLK and /CLK signals, to provide a clearer ("cleaner") internal clock signal CLKI. This can compensate for distortions in the CLK and /CLK signal caused by system clock signal line capacitance, noise, and transmission line effects.

Figure 8:
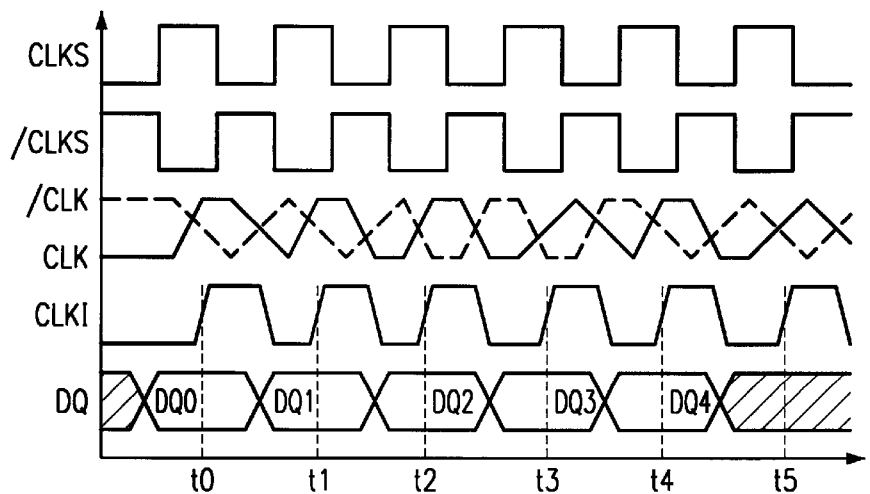
FIG. 8 is a timing diagram illustrating the operation of the preferred embodiment.

The operation of the preferred embodiment is best understood with reference to FIG. 8. FIG. 8 is a timing diagram setting forth a number of waveforms including the CLK, /CLK, and CLKI signals previously described. In addition, the system differential clock signals, as taken at the system clock source, are shown as CLKS and /CLKS. It is thus understood that the CLK and /CLK signals are intended to represent the CLKS and /CLKS signals after some distortion has occurred, due to line capacitance, noise, and/or transmission line effects. Because the complementary nature of the CLK and /CLK signals is used to generate the CLKI signal, the /CLK signal is shown superimposed over the CLK signal. FIG. 8 also sets forth a DQ signal which represents input data values that are to be latched by the preferred embodiment.

Figure 4:
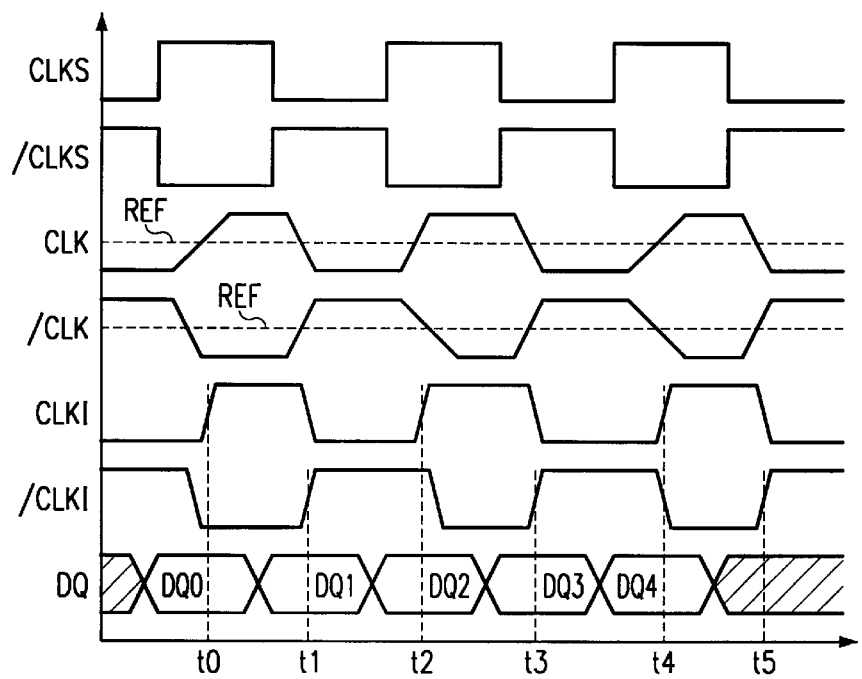
FIG. 4 is a timing diagram illustrating the operation of the DDR RAM set forth in FIG. 1.

It is noted that the differential clock signals of FIG. 8 are shown to be running at twice the frequency of the differential clock signals set forth in FIG. 4. This illustrates how the preferred embodiment, by being able to "clean" up the faster differential clock signals, can run at higher frequencies, providing improved performance without the unwanted added complexity of DDR RAM approach of FIG. 1.

FIG. 8 also illustrates how the comparison between the CLK and /CLK signals generates the CLKI signal. When the CLK signal is low and the /CLK signal is high, the CLKI signal is low. As the CLK signal transitions high and /CLK signal transitions low, once the CLK signal is greater than the /CLK signal, the CLKI signal will go high. In the subsequent transition (CLK going low and /CLK going high), once the CLK signal is lower than the /CLK signal, the CLKI signal will go low. In this manner, the two differential clock signals (CLK and /CLK) are compared with one another, rather than a reference signal, to generate a CLKI signal.

It is understood that the CLKI signal could be further modified by waveshaping circuits, or the like, to create a more square waveform. Along these same lines, the CLKI signal could be shifted in phase with a delay locked loop (DLL) or phase locked loop (PLL) circuit.

Figure 1:
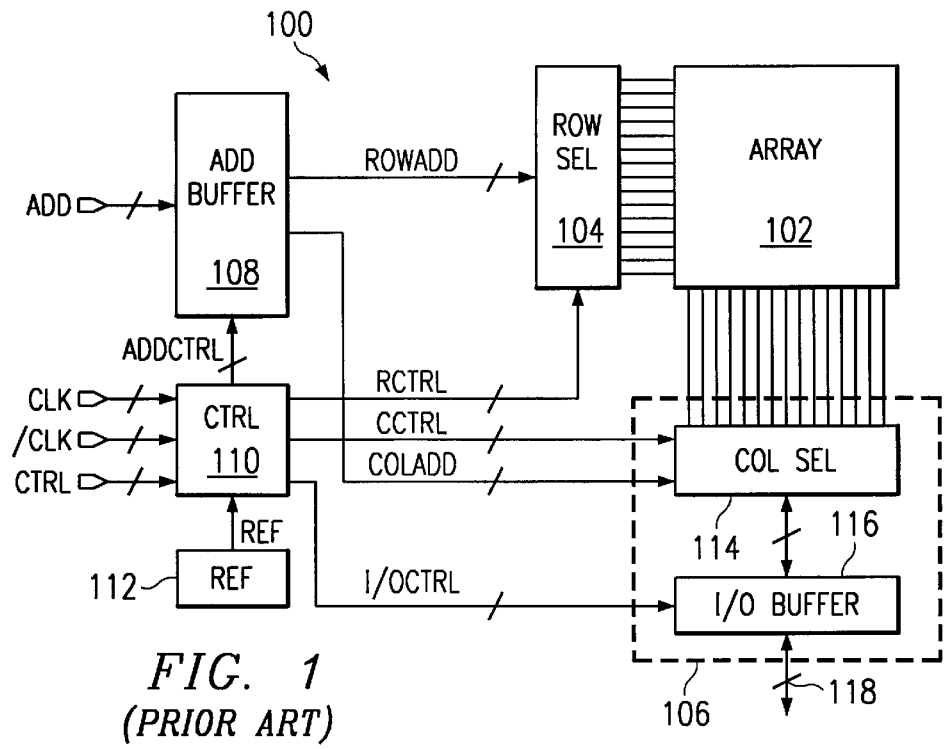
FIG. 1 is a block schematic diagram of a prior art approach to a double data rate (DDR) synchronous random access memory (RAM).
Figure 2:
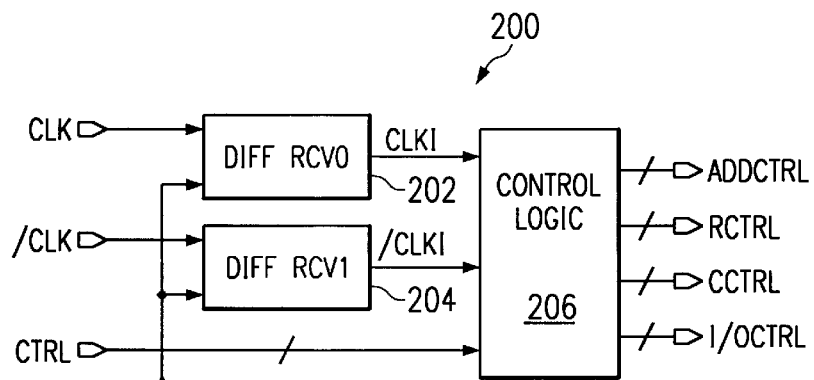
FIG. 2 is a block schematic diagram of timing and control circuit for the DDR RAM of FIG. 1.
Figure 3:
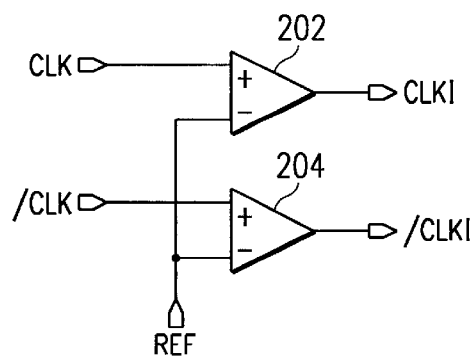
FIG. 3 is schematic diagram illustrating differential receiver circuits of the DDR RAM of FIG. 1.

By comparing the DQ waveforms of FIG. 4 and FIG. 8, it is shown that when the CLKS and /CLKS signals are run at twice the frequency of as those set forth in FIG. 4, the preferred embodiment can provide performance equivalent to that of the DDR RAM of FIG. 1. In this manner, by running the system clock at a higher speed, a less complex, more easily implemented SDRAM can be provided with performance equivalent to that of the DDR RAM.

It is understood that while the preferred embodiment sets forth an SDRAM, the teachings set forth herein can be applicable to other types of devices that are used in systems having differential clock signals. As just a few examples, static RAMs (SRAMs), electrically erasable and programmable read only memories (EEPROMs), and ferroelectric RAMs (FeRAMs) may benefit from the clock timing approach illustrated by the preferred embodiment.

Thus, although the present invention has been described in detail, it is understood that various changes, substitutions, and alterations could be made without departing from the spirit and scope of the invention as defined by the appended claims.

What is claimed is:

1. A semiconductor memory device, comprising:
    an array of memory cells including a plurality of memory cells disposed in rows and columns;
    a column select circuit coupled between the array of memory cells and a plurality of data input/outputs (I/Os), the column select circuit providing access to selected columns of the array of memory cells by way of the I/Os, the column select circuit being enabled in synchronism with a single internal control clock signal; and
    a clock circuit that receives a first differential system clock signal and a second differential system clock signal that is complementary to the first clock signal, and generates the single internal control clock signal, the single internal control clock signal having a first logic value when the first differential system clock signal is greater than the second differential system clock signal, and a second logic value when the first differential system clock signal is less than the second differential system clock signal, wherein the single internal control clock signal substantially compensates for any degradation in the first and second differential system clock signals.

2. The semiconductor memory device of claim 1, wherein:
    the array of memory cells includes dynamic random access memory (DRAM) cells.

3. The semiconductor memory device of claim 1, wherein:
    the column select circuit further receives column address information.

4. The semiconductor memory device of claim 1, further including:
    a row select circuit that provides access to selected rows within the array of memory cells, the row select circuit being enabled in synchronism with the control clock signal.

5. The semiconductor memory device of claim 4, wherein:
    the row select circuit further receives row address information.

6. The semiconductor memory device of claim 1, wherein:
    the clock circuit includes an amplifier circuit having a first input coupled to the first differential system clock signal and a second input coupled to the second differential system clock signal.

7. The semiconductor memory device of claim 6, wherein:
    the amplifier circuit includes a differential amplifier.

8. A random access memory (RAM) having a plurality of memory cells, comprising:
    a first clock node that receives a first differential system clock signal that varies between a first logic value and a second logic value;
    a second clock node that receives a second differential system clock signal that is generally the inverse of the first clock signal; and
    a comparator circuit having a first input coupled to the first clock node, a second input coupled to the second clock node, and an output node, the comparator circuit driving the output node to a first logic level when the first input is less than the second input and to a second logic level when the second input is less than the first input, the signal at the output node controlling the access to memory cells of the RAM, wherein the signal at the output node substantially compensates for any degradation in the first and second differential system clock signals.

9. The RAM of claim 8, wherein:

the comparator circuit includes an amplifier having a plus node and a minus node, the plus node being coupled to the first clock node, the minus node being coupled to the second clock node.

10. The RAM of claim 8, wherein:

the amplifier is a differential amplifier.

11. The RAM of claim 8, wherein:

the output node of the comparator circuit is coupled to a control logic circuit.

12. The RAM of claim 11, wherein:

the control logic circuit provides timing signals that control access to the memory cells of the RAM.

13. A method for operating a synchronous memory device that receives differential clock signals at a first frequency, the method comprising the steps of:

receiving the differential clock signals;

comparing the differential clock signals to one another;

generating a single internal clock signal at the first frequency based upon the comparison between the differential clock signals, wherein the single internal clock signal substantially compensates for any degradation in the differential clock signals; and accessing memory cells within the synchronous memory device according to the single internal clock signal.

14. The method of claim 13, wherein:

the step of comparing the differential clock signals includes coupling the differential clock signals to a differential amplifier.

15. The method of claim 13, wherein:

the step of generating an internal clock signal includes comparing a first differential clock signal to a second differential clock signal and causing the internal clock signal to be at a first logic value when the first differential clock signal is greater than the second differential clock signal, and causing the internal clock signal to be at a second logic value when the first differential clock signal is less than the second differential clock signal.

16. The method of claim 13, wherein:

the synchronous memory device receives a plurality of address signals; and step of accessing memory cells includes activating address buffer circuits that latch the address signals according to the internal clock signal.

17. The method of claim 13, wherein:

the memory cells of the synchronous memory device are arranged into columns, the memory cells of columns being coupled to a column select circuit; and the step of accessing memory cells includes activating the column select circuit according to the internal clock signal.

18. The method of claim 13, wherein:

the memory cells of the synchronous memory device are arranged into rows, the memory cells of rows being coupled to a row select circuit; and the step of accessing memory cells includes activating the row select circuit according to the internal clock signal.

* * * * *